US012804957B2

(12) United States Patent
Kumar et al.

(10) Patent No.: US 12,804,957 B2
(45) Date of Patent: Nov. 17, 2026

(54) COMB FIELD EFFECT TRANSISTOR (FET) AND METHOD OF MANUFACTURING THE SAME

(71) Applicant: Samsung Electronics Co., Ltd., Suwon-si (KR)

(72) Inventors: Aravindh Kumar, Mountain View, CA (US); Mehdi Saremi, Danville, CA (US); Ming He, San Jose, CA (US); Muhammed Ahosan Ul Karim, San Jose, CA (US); Rebecca Park, Mountain View, CA (US); Harsono Simka, Saratoga, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 369 days.

(21) Appl. No.: 18/420,348

(22) Filed: Jan. 23, 2024

(65) Prior Publication Data

US 2024/0405128 A1 Dec. 5, 2024

Related U.S. Application Data

(60) Provisional application No. 63/471,188, filed on Jun. 5, 2023.

(51) Int. Cl.
*H10D 30/67* (2025.01)
*H10D 30/01* (2025.01)
(Continued)

(52) U.S. Cl.
CPC ....... *H10D 30/6757* (2025.01); *H10D 30/014* (2025.01); *H10D 30/43* (2025.01);
(Continued)

(58) Field of Classification Search
CPC .. H10D 30/6757; H10D 30/014; H10D 30/43; H10D 30/6735; H10D 64/517;
(Continued)

(56) References Cited

U.S. PATENT DOCUMENTS 10,546,928 B2 1/2020 Hashemi et al.
2020/0343361 A1 10/2020 Cheng
(Continued)

FOREIGN PATENT DOCUMENTS

EP 3 389 095 A1 10/2018
WO WO 2022/258151 A1 12/2022

OTHER PUBLICATIONS

Li, Xinhao, et al. "A three-dimensional simulation study of the novel comb-like-channel field-effect transistors for the 5-NM technology node and beyond." IEEE Transactions on Electron Devices, vol. 69, No. 9, Sep. 2022, pp. 4786-4790, https://doi.org/10.1109/ted.2022.3188589. (Year: 2022).*
(Continued)

*Primary Examiner* — J. E. Schoenholtz
(74) *Attorney, Agent, or Firm* — Womble Bond Dickinson (US) LLP

(57) ABSTRACT

A field-effect transistor includes a substrate, a channel on the substrate including a stem including silicon extending in a vertical direction from the substrate and a number of prongs including silicon extending in a horizontal direction from the stem and spaced apart from each other along the vertical direction, an interfacial layer surrounding the stem and the prongs of the channel, a dielectric layer on the interfacial layer and surrounding the stem and the prongs of the channel, and a metal gate on the dielectric layer and surrounding the stem and the prongs of the channel.

20 Claims, 14 Drawing Sheets

(51) Int. Cl.
*H10D 30/43* (2025.01)
*H10D 64/27* (2025.01)
*H10D 84/85* (2025.01)

(52) U.S. Cl.
CPC ....... *H10D 30/6735* (2025.01); *H10D 64/517* (2025.01); *H10D 84/85* (2025.01)

(58) Field of Classification Search
CPC .... H10D 84/85; H10D 30/019; H10D 30/501; H10D 62/118; H10D 84/0167; H10D 84/038; H10D 84/852; H10D 84/853; H10D 84/0172; H10D 84/0193; H10D 84/834; B82Y 10/00
See application file for complete search history.

(56) References Cited

U.S. PATENT DOCUMENTS

| | | | | |
|---|---|---|---|---|
| 2021/0376076 | A1* | 12/2021 | Su | H10D 62/116 |
| 2022/0328628 | A1 | 10/2022 | Zhu | |
| 2022/0416023 | A1 | 12/2022 | Zhu | |
| 2023/0133296 | A1* | 5/2023 | Bao | H10D 64/0134 257/368 |
| 2023/0133545 | A1* | 5/2023 | Frougier | H10D 84/038 257/329 |
| 2023/0154925 | A1* | 5/2023 | Cheng | H10D 86/201 257/312 |
| 2023/0187497 | A1 | 6/2023 | Zhu et al. | |
| 2023/0187560 | A1 | 6/2023 | Zhu | |

OTHER PUBLICATIONS

Mukesh, Sagarika, and Jingyun Zhang. “A review of the gate-all-around nanosheet FET process opportunities.” Electronics, vol. 11, No. 21, Nov. 3, 2022, p. 3589, https://doi.org/10.3390/electronics11213589. (Year: 2022).*

Sisto, Giuliano, et al. “Evaluation of nanosheet and forksheet width modulation for digital IC design in the sub-3-nm Era.” IEEE Transactions on Very Large Scale Integration (VLSI) Systems, vol. 30, No. 10, Oct. 2022, pp. 1497-1506, https://doi.org/10.1109/tvlsi.2022.3190080. (Year: 2022).*

* cited by examiner

COMB FIELD EFFECT TRANSISTOR (FET) AND METHOD OF MANUFACTURING THE SAME

CROSS-REFERENCE TO RELATED APPLICATION(S)

The present application claims priority to and the benefit of U.S. Provisional Application No. 63/471,188, filed Jun. 5, 2023, the entire content of which is incorporated herein by reference.

BACKGROUND

1. Field

The present disclosure relates to field-effect transistors (FETs) and methods of manufacturing FETs.

2. Description of the Related Art

A variety of different types of field-effect transistors (FETs) exist, including finFETs and nanosheet FETs. Other FET configurations have also been proposed, including a forksheet FET. However, it is desirable to increase the effective width ($W_{eff}$) of FETs to increase their drive current.

The above information disclosed in this Background section is only for enhancement of understanding of the background of the invention and therefore it may contain information that does not constitute prior art.

SUMMARY

The present disclosure relates to various embodiments of a field-effect transistor. In one embodiment, the field-effect transistor includes a substrate, a channel on the substrate including a stem extending in a vertical direction from the substrate and a number of prongs extending in a horizontal direction from the stem and spaced apart from each other along the vertical direction, an interfacial layer surrounding the stem and the prongs of the channel, a dielectric layer on the interfacial layer and surrounding the stem and the prongs of the channel, and a metal gate on the dielectric layer and surrounding the stem and the prongs of the channel.

The stem may extend below a lowermost prong of the prongs.

The stem may be electrically connected to the substrate.

The stem may be separated from the substrate.

The stem may extend above an uppermost prong of the prongs.

The stem may extend below a lowermost prong of the prongs and above an uppermost prong of the prongs.

The substrate may include a silicon layer.

The substrate may include a dielectric layer.

The substrate may include a silicon layer and a dielectric layer on the silicon layer.

The stem may have a width of approximately 4-6 nm and a height of approximately 45-55 nm. Each of the prongs may have a width of approximately 10-20 nm and a height of approximately 4-6 nm. Adjacent prongs may be spaced apart in the vertical direction by approximately 10-15 nm.

The present disclosure is also directed to various embodiments of an inverter standard cell. In one embodiment, the inverter standard cell includes a first field-effect transistor and a second field-effect transistor each including a channel having a stem extending in a horizontal direction and a number of prongs extending in a horizontal direction from the stem and spaced apart from each other along the vertical direction.

The inverter standard cell may also include a dielectric wall between the first field-effect transistor and the second field-effect transistor.

The dielectric wall may have a width of approximately 15-20 nm.

The first field-effect transistor may be an NMOS transistor and the second field-effect transistor may be a PMOS transistor, or the first field-effect transistor may be a PMOS transistor and the second field-effect transistor may be an NMOS transistor.

The first field-effect transistor and the second field-effect transistor may both be NMOS transistors or both PMOS transistors.

The present disclosure is also directed to various methods of manufacturing a cell. In one embodiment, the method includes forming a stack of alternating dielectric layers and semiconductor layers on a substrate, forming a hard mask on the stack, and etching the stack through the hard mask to form trench in the stack that divides the stack into a first stack and a second stack. The semiconductor layers in the first stack include a number of first prongs and the semiconductor layers in the second stack include a number of second prongs. The method also includes epitaxially depositing silicon in the trench and along inner sidewalls of the first stack and the second stack. The silicon includes a first stem connected to the first prongs and a second stem connected to the second prongs. The method further includes epitaxially depositing SiGe in the trench and along the first stem and the second stem, forming a dielectric wall in the trench, etching the dielectric layers in each of the first stack and the second stack, forming a first interfacial layer surrounding the first stem and the first prongs and a second interfacial layer surrounding the second stem and the second prongs, and forming a first metal gate on the first interfacial layer and surrounding the first stem and the first prongs and a second metal gate on the second interfacial layer and surrounding the second stem and the second prongs.

The trench may extend into the substrate.

In another embodiment, a method of manufacturing a cell includes forming a stack of alternating dielectric layers and semiconductor layers on a substrate, forming a hard mask on the stack, and etching the stack through the hard mask to form trench in the stack that divides the stack into a first stack and a second stack. The semiconductor layers in the first stack include first prongs and the semiconductor layers in the second stack include second prongs. The method also includes epitaxially depositing silicon to fill the trench, forming spacers on opposite sides of the trench, etching a portion of the silicon in the trench to form a first stem connected to the first prongs and a second stem connected to the second prongs, forming a dielectric wall in the portion of the silicon, etching the dielectric layers in each of the first stack and the second stack, forming a first interfacial layer surrounding the first stem and the first prongs and a second interfacial layer surrounding the second stem and the second prongs, and forming a first metal gate on the first interfacial layer and surrounding the first stem and the first prongs and a second metal gate on the second interfacial layer and surrounding the second stem and the second prongs.

A portion of the silicon may extend above an uppermost semiconductor layer, and the method may include etching the portion of the silicon to be narrower than the trench prior to the forming of the spacers.

The trench may extend into the substrate.

This summary is provided to introduce a selection of concepts that are further described below in the detailed description. This summary is not intended to identify key or essential features of the claimed subject matter, nor is it intended to be used in limiting the scope of the claimed subject matter. One or more of the described features and/or tasks may be combined with one or more other described features and/or tasks to provide a workable device and/or a workable method.

BRIEF DESCRIPTION OF THE DRAWINGS

The features and advantages of embodiments of the present disclosure will be better understood by reference to the following detailed description when considered in conjunction with the accompanying figures. In the figures, like reference numerals are used throughout the figures to reference like features and components. The figures are not necessarily drawn to scale.

DETAILED DESCRIPTION

Figure 1:
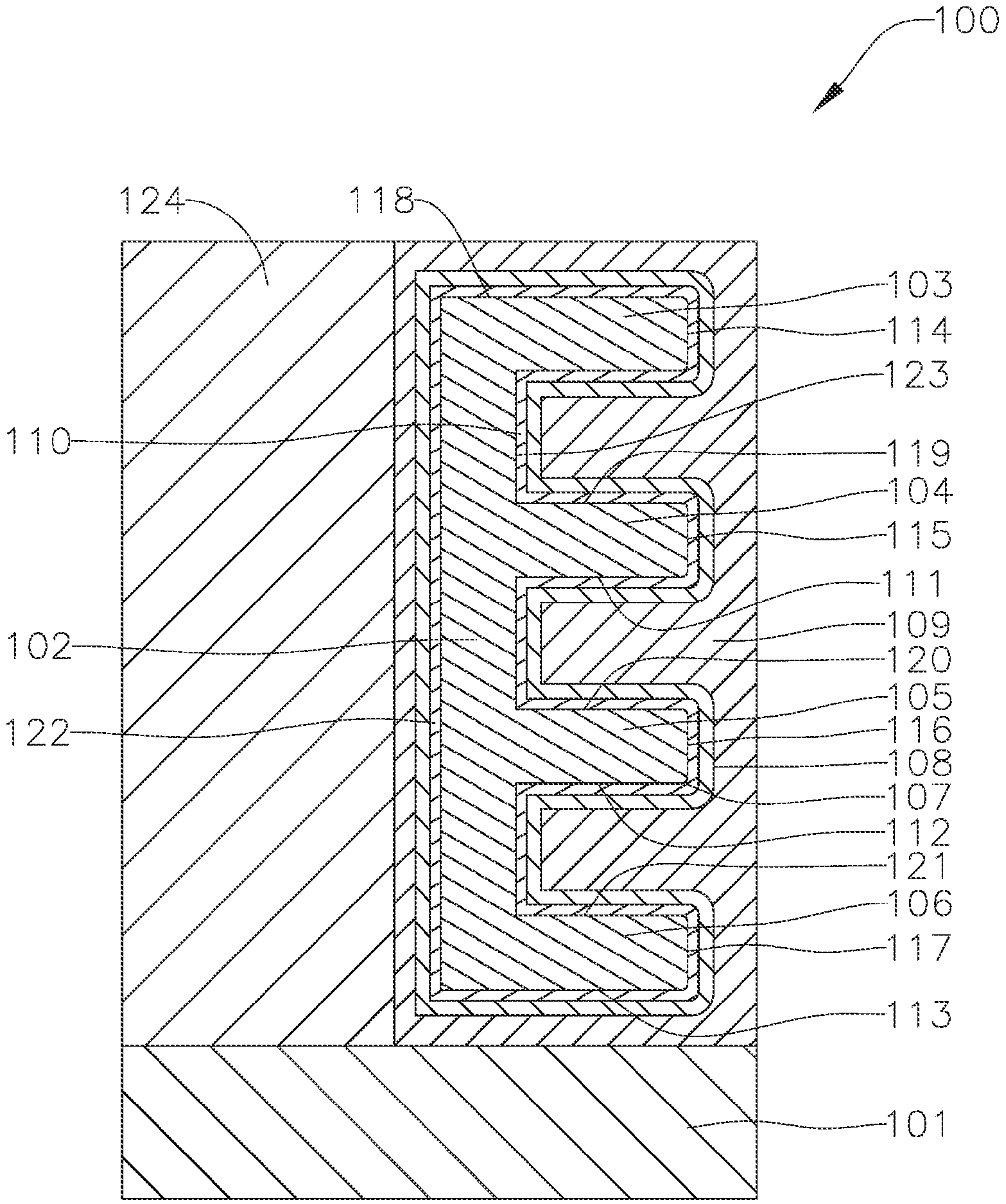
FIG. 1 is a schematic view of a field effect transistor (FET) according to one embodiment of the present disclosure.

The present disclosure relates to various embodiments of a field-effect transistor (FET) and methods of manufacturing FETs. In one or more embodiments, the FETs of the present disclosure are configured to increase drive current by approximately 16% to approximately 31%, which increases the speed of operation, and achieve up to approximately 17% area scaling, which enables cost saving, compared to conventional FETs.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as “beneath,” “below,” “lower,” “under,” “above,” “upper,” and the like, may be used herein for ease of explanation to describe one element or feature’s relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as “below” or “beneath” or “under” other elements or features would then be oriented “above” the other elements or features. Thus, the example terms “below” and “under” can encompass both an orientation of above and below. The device may be otherwise oriented (e.g., rotated 90 degrees or at other orientations) and the spatially relative descriptors used herein should be interpreted accordingly.

It will be understood that, although the terms “first,” “second,” “third,” etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being “on,” “connected to,” or “coupled to” another element or layer, it can be directly on, connected to, or coupled to the other element or layer, or one or more intervening elements or layers may be present. In addition, it will also be understood that when an element or layer is referred to as being “between” two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms “a” and “an” are intended to include the plural forms as well, unless the context clearly indicates otherwise. It will be further understood that the terms “comprises,” “comprising,” “includes,” and “including,” when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

With reference now to FIG. 1, a field effect transistor (FET) 100 according to one embodiment of the present disclosure includes a substrate 101, a stem 102 extending in a vertical direction (or substantially vertical direction) from the substrate 101, and a plurality of prongs 103, 104, 105, 106 extending in a horizontal direction (or substantially horizontal direction) from the stem 102. The stem 102 connects the prongs 103, 104, 105, 106 together along one side (e.g., the left side) of the prongs 103, 104, 105, 106. The prongs 103, 104, 105, 106 are spaced apart from each other along the stem 102 in the vertical direction. In one or more embodiments, adjacent prongs 103, 104, 105, 106 are spaced apart from each other by approximately 10 nm in the vertical direction. Although in the illustrated embodiment the FET 100 includes four prongs 103, 104, 105, 106 in one or more embodiments, the FET 100 may include any other suitable number of prongs, such as less than four prongs or more than four prongs.

In one or more embodiments, each of the prongs 103, 104, 105, 106 may have a height in the vertical direction of approximately 4-6 nm and a length in the horizontal direction of approximately 10-20 nm. Additionally, in one or more embodiments, the stem 102 may have a height in the vertical direction of approximately 50 nm and a width in the horizontal direction of approximately 4-6 nm. In one or more embodiments, the combined width of the stem 102 and the prongs 103, 104, 105, 106 in the horizontal direction is approximately 15-25 nm. In one or more embodiments, the FET 100 has a 16.3% increase in the effective width (Wett) compared to a related art nanosheet FET and a 30.5% increase compared to a related art forksheet FET having the same area footprint.

In the illustrated embodiment, an upper end of the stem 102 is flush or substantially flush (e.g., co-planar or substantially co-planar) with an upper end of the uppermost prong 103, and a lower end of the stem 102 is flush or substantially flush (e.g., co-planar or substantially co-planar) with a lower end of the lowermost prong 106. That is, in one or more embodiments, the stem 102 does not extend beyond the uppermost prong 103 or the lowermost prong 106.

In the illustrated embodiment, the FET 100 also includes an interfacial layer 107 on the stem 102 and the prongs 103, 104, 105, 106, a dielectric layer 108 having a high dielectric constant on the interfacial layer 107, and a metal gate 109 on the dielectric layer 108 (e.g., the dielectric layer 108 is between the interfacial layer 107 and the metal gate 109). In the illustrated embodiment, each of the interfacial layer 107, the dielectric layer 108, and the metal gate 109 completely surround the combined silicon structure of the stem 102 and the prongs 103, 104, 105, 106. That is, each of the interfacial layer 107, the dielectric layer 108, and the metal gate 109 extends along lower surfaces 110, 111, 112, 113, outer sidewall surfaces 114, 115, 116, 117, and upper surfaces 118, 119, 120, 121 of each of the prongs 103, 104, 105, 106, respectively, along an inner sidewall surface 122 of the stem 102, and along portions of an outer sidewall surface 123 of the stem 102 between the prongs 103, 104, 105, 106.

Additionally, in one or more embodiments, the FET 100 includes a dielectric wall 124. In the illustrated embodiment, the prongs 103, 104, 105, 106 extend away from the dielectric wall 109. In one or more embodiments, the dielectric wall 123 has a width in the horizontal direction in a range from approximately 15 nm to approximately 20 nm.

Figure 2:
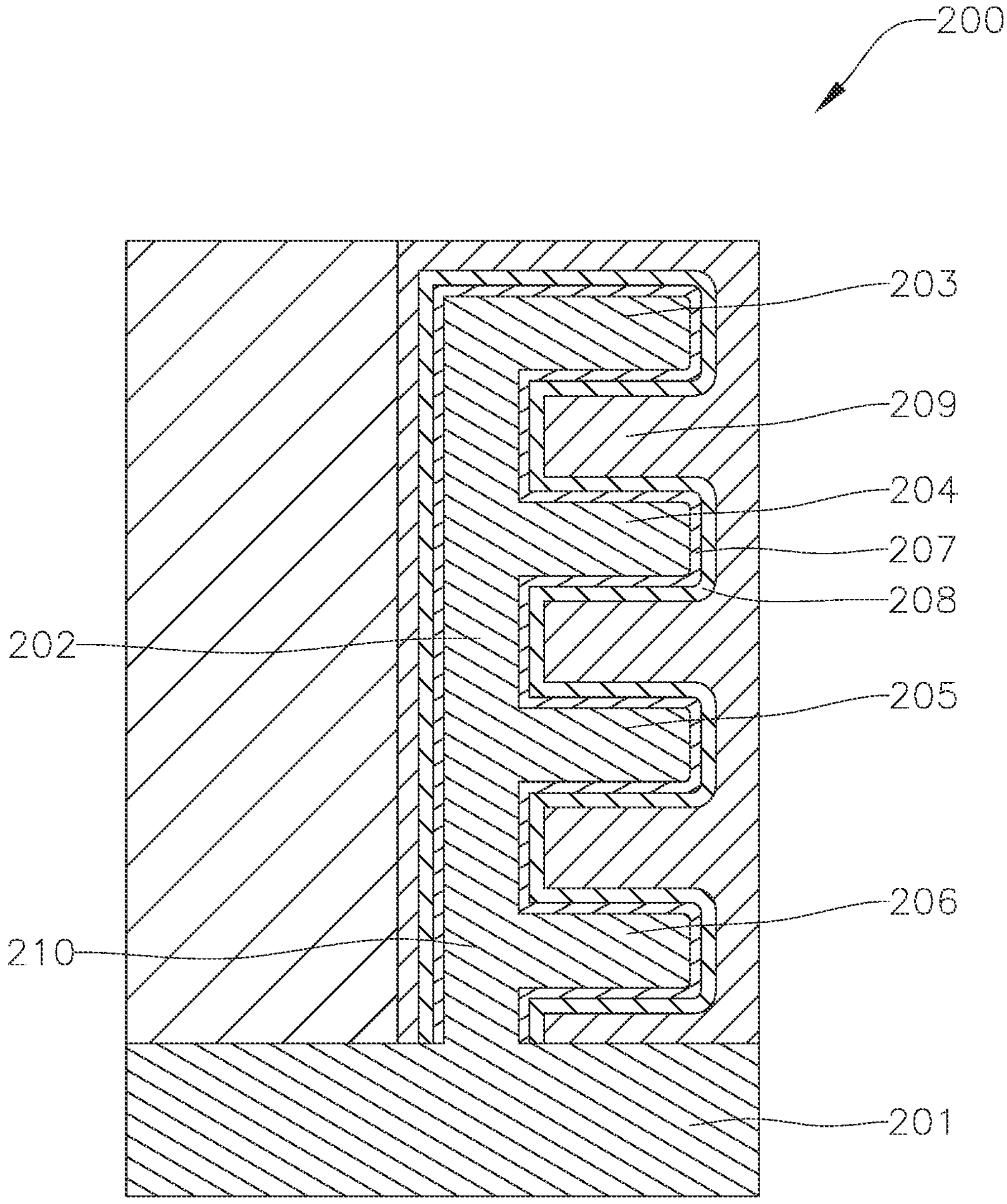
FIG. 2 is a schematic view of a FET including a downward protrusion of a silicon (Si) stem connected to the substrate according to another embodiment of the present disclosure.

With reference now to FIG. 2, a FET 200 according to another embodiment of the present disclosure includes a substrate 201, a stem 202 extending in a vertical direction (or substantially vertical direction) from the substrate 201, a plurality of prongs 203, 204, 205, 206 extending in a horizontal direction (or substantially horizontal direction) from the stem 202, an interfacial layer 207 on the stem 202 and the prongs 203, 204, 205, 206, a dielectric layer 208 having a high dielectric constant on the interfacial layer 207, and a metal gate 209 on the dielectric layer 207. The FET 200 may be the same as the embodiment of the FET 100 depicted in FIG. 1, except the stem 202 may include a protrusion portion 210 that extends below the lowermost prong 206 and is connected to the substrate 201. That is, the protrusion portion 210 extends from the substrate 201 to a lower end of the lowermost prong 206. Connecting the FET 200 to the substrate 201 is configured to reduce hotspots which might otherwise occur. The embodiment of the FET 200 illustrated in FIG. 2 may be utilized in high-performance computing (HPC) applications.

Figure 3:
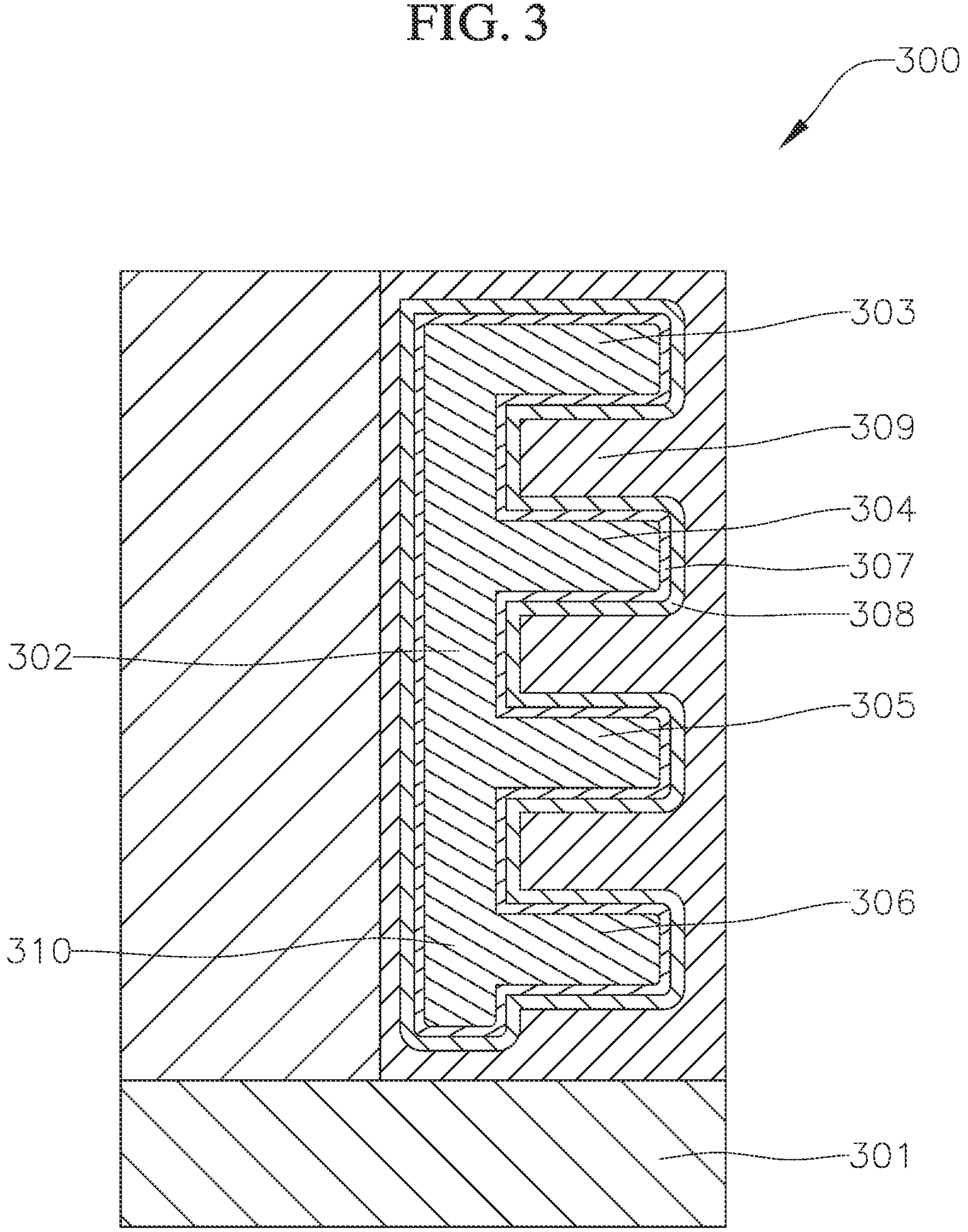
FIG. 3 is a schematic view of a FET including a downward protrusion of a silicon (Si) stem separated from the substrate according to another embodiment of the present disclosure.

With reference now to FIG. 3, a FET 300 according to another embodiment of the present disclosure includes a substrate 301, a stem 302 extending in a vertical direction (or substantially vertical direction) from the substrate 301, a plurality of prongs 303, 304, 305, 306 extending in a horizontal direction (or substantially horizontal direction) from the stem 302, an interfacial layer 307 on the stem 302 and the prongs 303, 304, 305, 306, a dielectric layer 308 having a high dielectric constant on the interfacial layer 307, and a metal gate 309 on the dielectric layer 307. The FET 300 may be the same as the embodiment of the FET 100 depicted in FIG. 1, except the stem 302 may include a protrusion portion 310 that extends below the lowermost prong 306. Unlike the embodiment of the FET 200 depicted in FIG. 2, the protrusion portion 310 is not connected to the substrate 301 (e.g., the protrusion portion 310 is separated from the substrate 301). That is, the protrusion portion 310 extends from a lower end of the lowermost prong 306 and is spaced apart from the substrate 301 by a preset distance. The protrusion portion 310 of the stem 302 may be provided for finer control of the effective width ($W_{eff}$) of the FET 300 and for additional drive current boost compared to the embodiment of the FET 100 depicted in FIG. 1.

Figure 4:
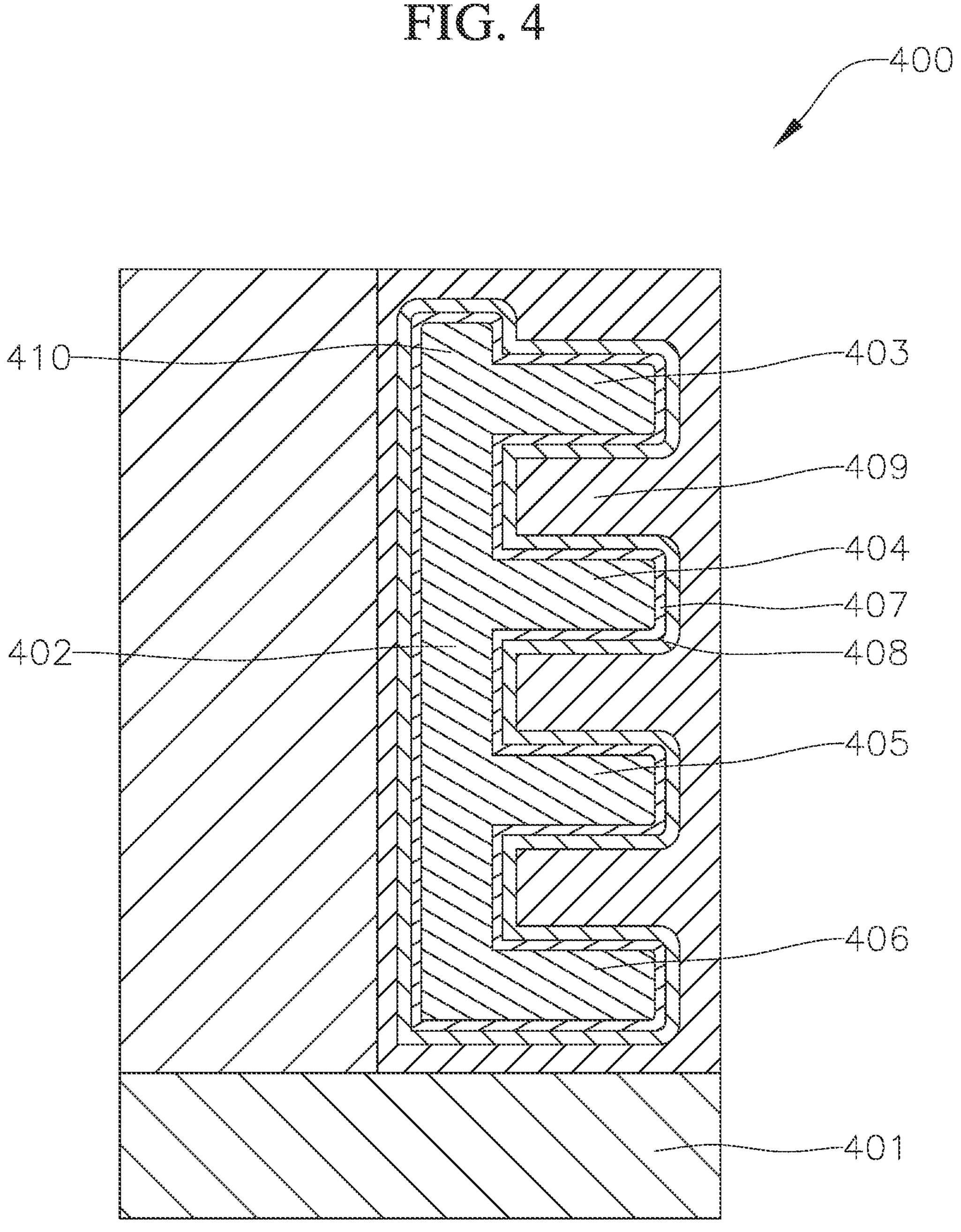
FIG. 4 is a schematic view of a FET including an upward protrusion of a silicon (Si) stem according to another embodiment of the present disclosure.

With reference now to FIG. 4, a FET 400 according to another embodiment of the present disclosure includes a substrate 401, a stem 402 extending in a vertical direction (or substantially vertical direction) from the substrate 401, a plurality of prongs 403, 404, 405, 406 extending in a horizontal direction (or substantially horizontal direction) from the stem 402, an interfacial layer 407 on the stem 402 and the prongs 403, 404, 405, 406, a dielectric layer 408 having a high dielectric constant on the interfacial layer 407, and a metal gate 409 on the dielectric layer 407. The FET 400 may be the same as the embodiment of the FET 100 depicted in FIG. 1, except the stem 402 may include a protrusion portion 410 that extends above the uppermost prong 403. That is, the protrusion portion 410 extends from an upper end of the uppermost prong 403. The protrusion portion 410 of the stem 402 may be provided for finer control of the effective width ($W_{eff}$) of the FET 400 and for additional drive current boost compared to the embodiment of the FET 100 depicted in FIG. 1.

Figure 5:
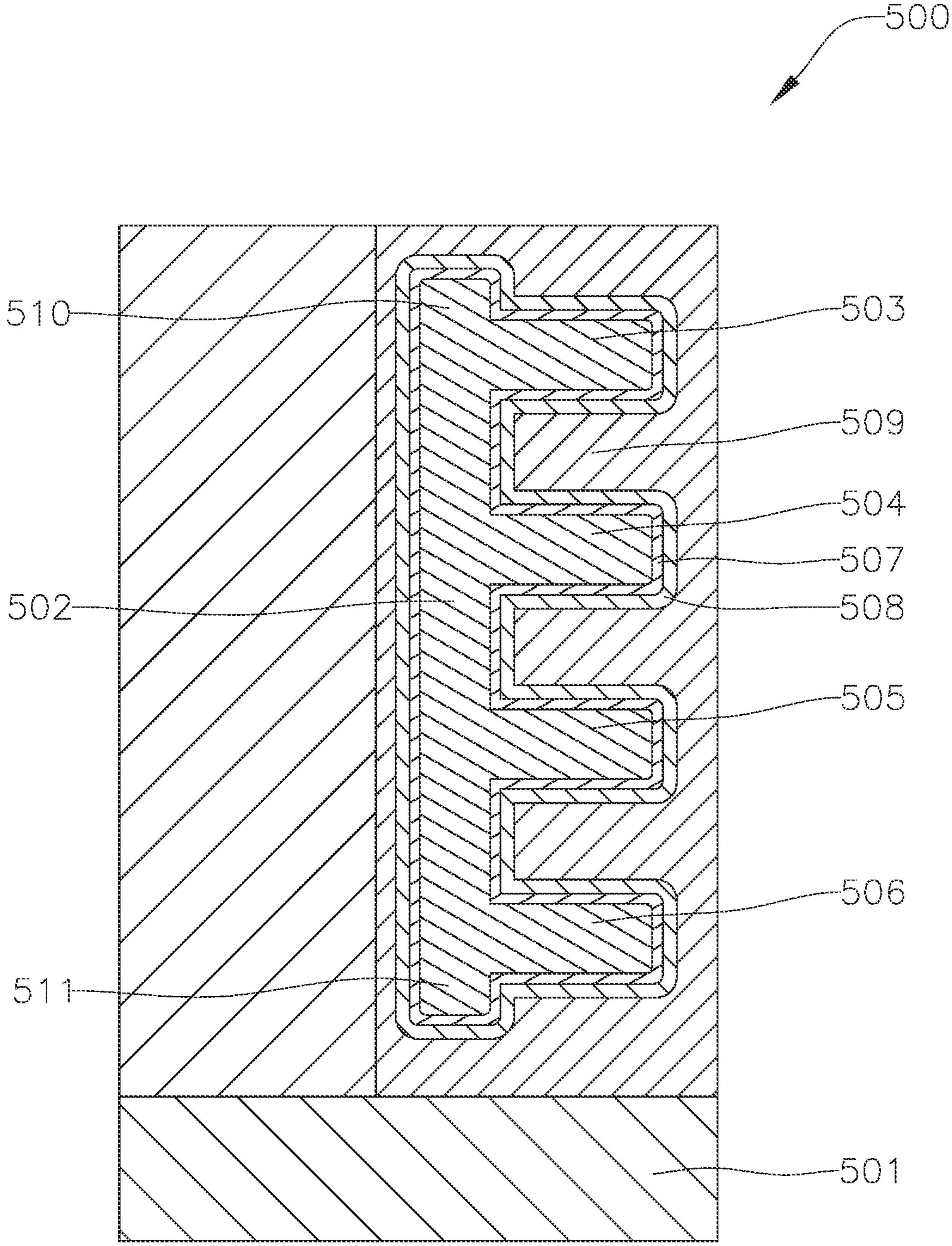
FIG. 5 is a schematic view of a FET including an upward and a downward protrusion of a silicon stem according to another embodiment of the present disclosure.

With reference now to FIG. 5, a FET 500 according to another embodiment of the present disclosure includes a substrate 501, a stem 502 extending in a vertical direction (or substantially vertical direction) from the substrate 501, a plurality of prongs 503, 504, 505, 506 extending in a horizontal direction (or substantially horizontal direction) from the stem 502, an interfacial layer 507 on the stem 502 and the prongs 503, 504, 505, 506, a dielectric layer 508 having a high dielectric constant on the interfacial layer 507, and a metal gate 509 on the dielectric layer 508. The FET 500 may be the same as the embodiment of the FET 100 depicted in FIG. 1, except the stem 502 may include a first protrusion portion 510 that extends above the uppermost prong 503 and a second protrusion portion 511 that extends below the lowermost prong 506. That is, the first protrusion portion 510 extends from an upper end of the uppermost prong 503 and the second protrusion portion 511 extends from a lower end of the lowermost prong 506. Although in the illustrated embodiment the second protrusion portion 511 is not connected to the substrate 501 (e.g., the second protrusion portion 511 is separated from the substrate 501), in one or more embodiments the second protrusion portion 511 may be connected to the substrate 501. The first and second protrusion portions 510, 511 of the stem 502 may be provided for finer control of the effective width ($W_{eff}$) of the FET 500 and for additional drive current boost compared to the embodiment of the FET 100 depicted in FIG. 1.

Figure 6:
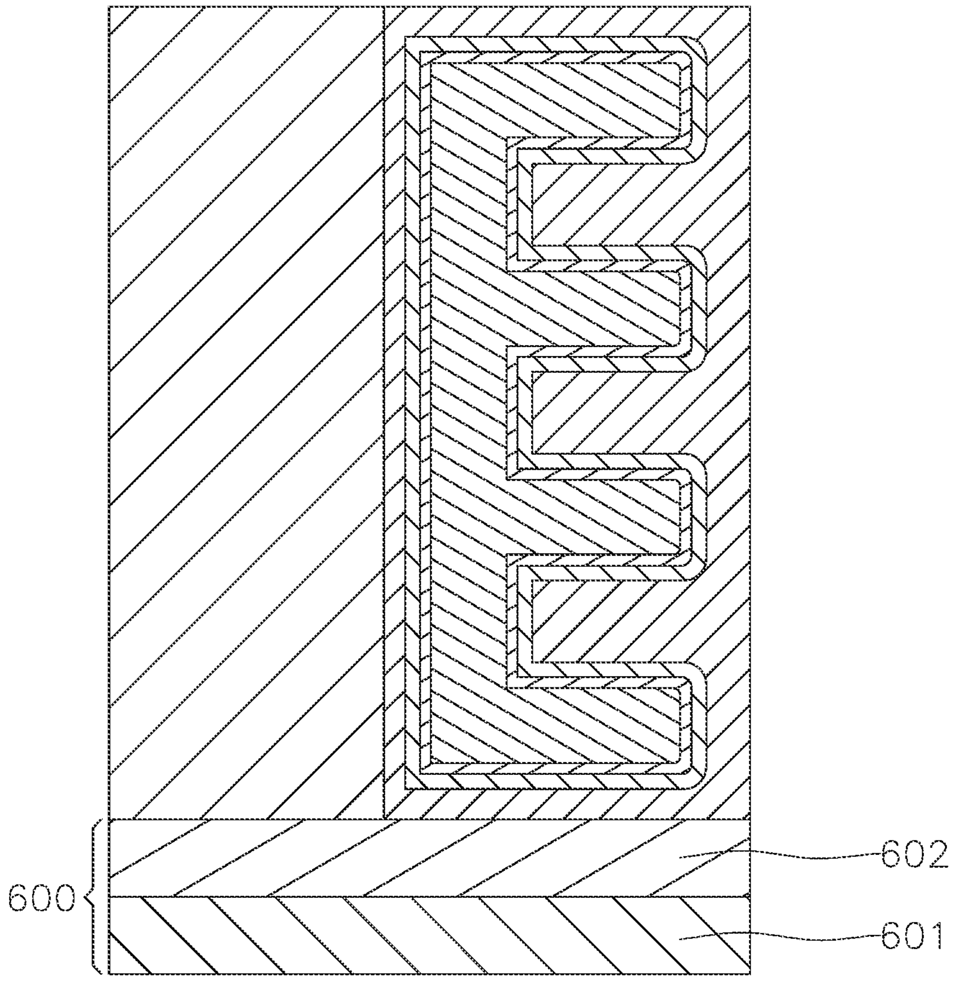
FIG. 6 is a schematic view of a FET including a substrate having a dielectric layer and a silicon layer according to another embodiment of the present disclosure.
Figure 7:
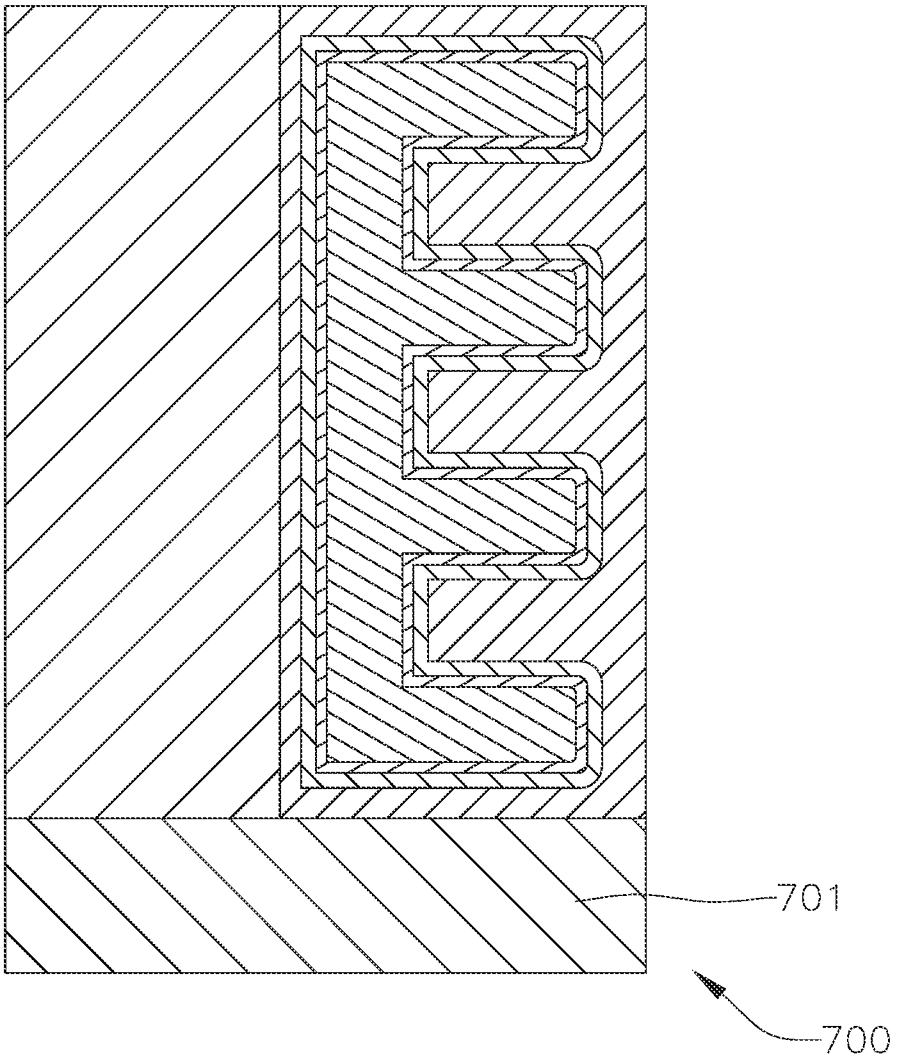
FIG. 7 is a schematic view of a FET including a silicon substrate according to another embodiment of the present disclosure.
Figure 8:
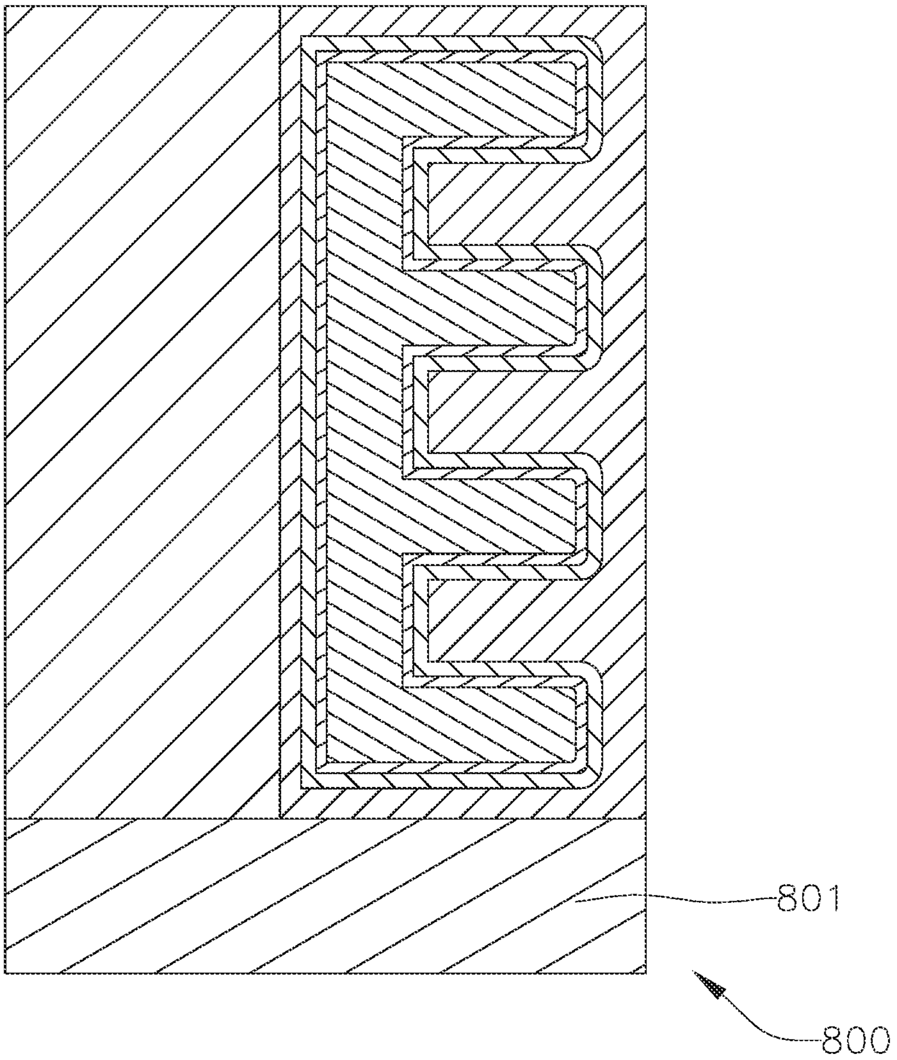
FIG. 8 is a schematic view of a FET including a dielectric substrate according to another embodiment of the present disclosure.

FIGS. 6-8 depict different configurations of a substrate according to various embodiments of the present disclosure. The configurations of the substrate depicted in FIGS. 6-8 may be utilized in any of the embodiments of the FETs 100, 200, 300, 400, and 500 depicted in FIGS. 1-5. In the embodiment depicted in FIG. 6, the substrate 600 includes a silicon layer 601 and a dielectric isolation layer 602 on the silicon layer 601. In the embodiment depicted in FIG. 7, the substrate 700 includes a silicon layer 701, and in FIG. 8, the substrate 800 includes a dielectric isolation layer 801. Including a bottom dielectric isolation layer in the substrate is configured to reduce the parasitic capacitance of the FET.

Figure 9:
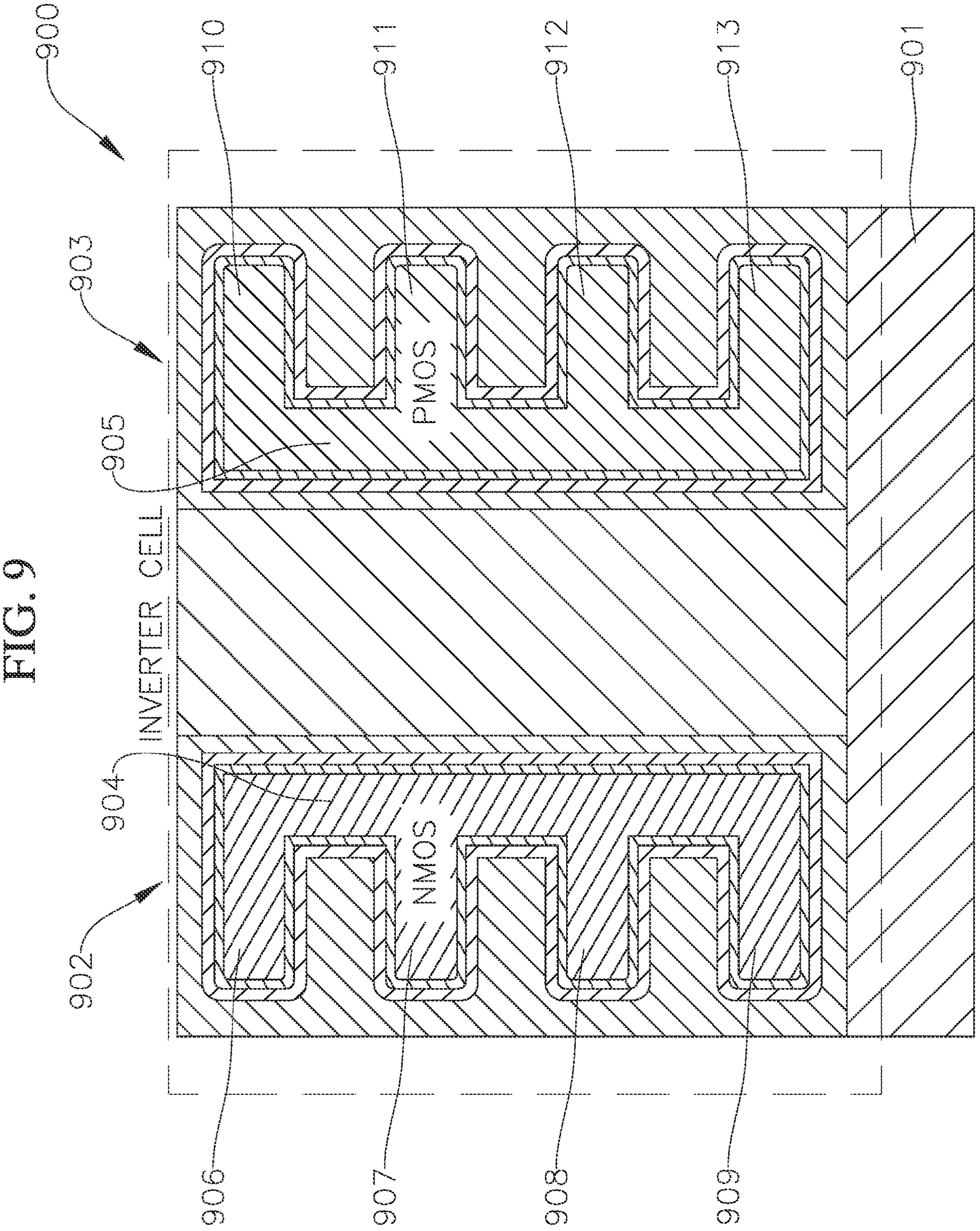
FIG. 9 is a schematic view of an inverter standard cell according to one embodiment of the present disclosure.

FIG. 9 depicts an inverter standard cell 900 according to one embodiment of the present disclosure. In the illustrated embodiment, the inverter standard cell 900 includes a substrate 901, a first field effect transistor (FET) 902 on the substrate 901, and a second FET 903 on the substrate 901. In the illustrated embodiment, each of the first FET 902 and the second FET 903 includes a stem 904, 905, respectively, extending in a vertical direction (or substantially vertical direction) from the substrate 901, and a plurality of prongs 906, 907, 908, 909 and 910, 911, 912, 913, respectively, extending in a horizontal direction (or substantially horizontal direction) from the stem 904, 905, respectively. In the illustrated embodiment, the prongs 906, 907, 908, 909 of the first FET 902 and the prongs 910, 911, 912, 913 of the second FET 903 extend away from each other in opposite directions. One of the first and second FETs 902, 903 may be an n-type FET and the other of the first and second FETs 902, 903 may be a p-type FET (e.g., the first FET 902 may be an n-type FET and the second FET 903 may be a p-type FET, or the first FET 902 may be a p-type FET and the second FET 903 may be n-type FET). The FETs 902, 903 may have the configuration of any of the FETs 100, 200, 300, 400, and 500 depicted in FIGS. 1-5. In the illustrated embodiment, the inverter standard cell 900 also includes a dielectric wall 914 separating the first FET 902 and the second FET 903. Accordingly, in the illustrated embodiment, the dielectric wall 914 is between FETs having different polarities.

Figure 10:
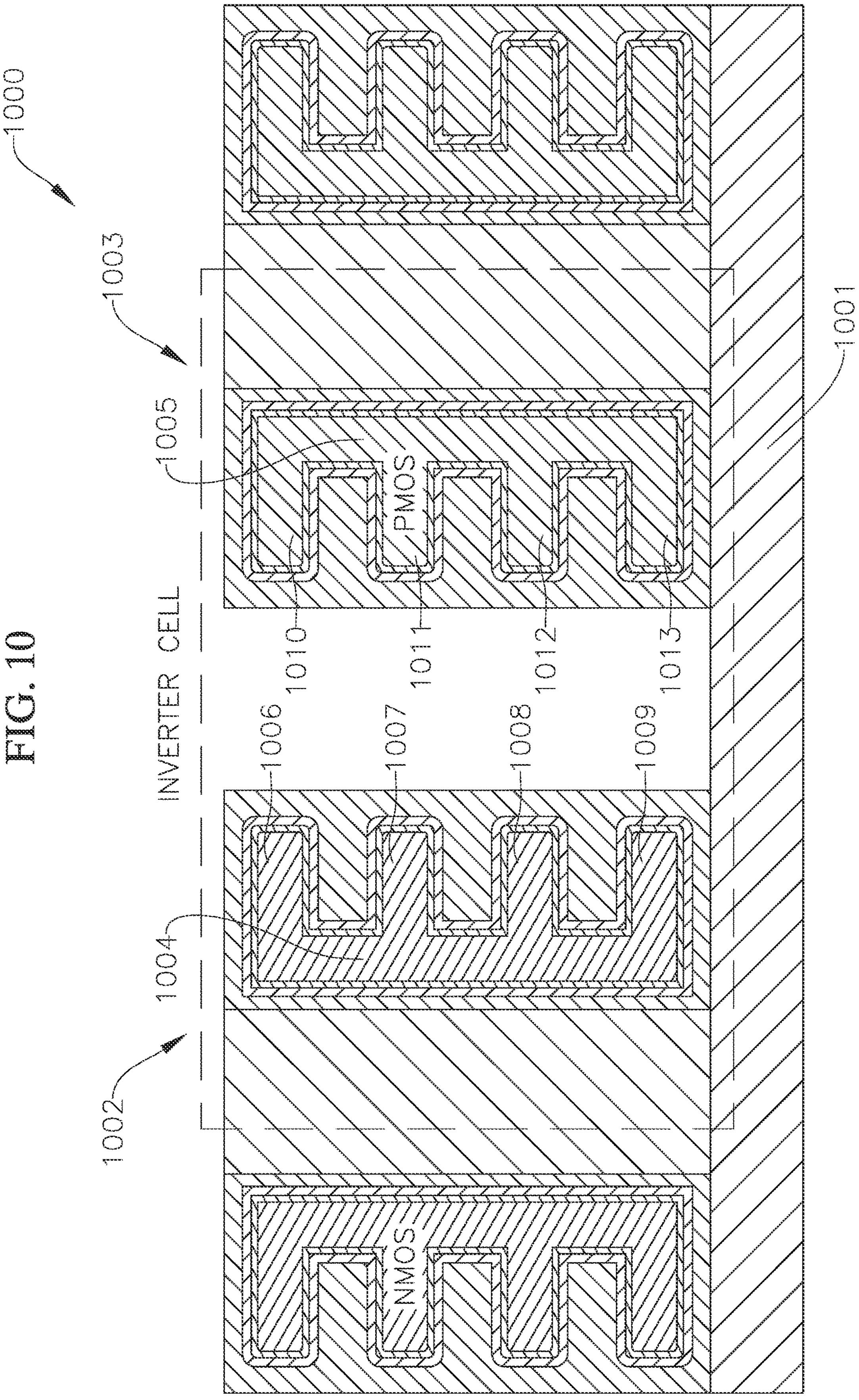
FIG. 10 is a schematic view of an inverter standard cell according to another embodiment of the present disclosure.

FIG. 10 depicts an inverter standard cell 1000 according to another embodiment of the present disclosure. In the illustrated embodiment, the inverter standard cell 1000 includes a substrate 1001, a first field effect transistor (FET) 1002 on the substrate 1001 and a second FET 1003 on the substrate 1001. In the illustrated embodiment, each of the first FET 1001 and the second FET 1002 includes a stem 1004, 1005, respectively, extending in a vertical direction (or substantially vertical direction) from the substrate 1001, and a plurality of prongs 1006, 1007, 1008, 1009 and 1010, 1011, 1012, 1013, respectively, extending in a horizontal direction (or substantially horizontal direction) from the stem 1005, 1006, respectively. In the illustrated embodiment, the prongs 1006, 1007, 1008, 1009 of the first FET 1001 and the prongs 1010, 1011, 1012, 1013 of the second FET 1002 extend away from each other in opposite directions (e.g., the prongs 1006, 1007, 1008, 1009 of the first FET 1001 and the prongs 1010, 1011, 1012, 1013 of the second FET 1002 extend away from the dielectric wall 1004). One of the first and second FETs 1002, 1003 may be an n-type FET and the other of the first and second FETs 1002, 1003 may be a p-type FET (e.g., the first FET 1002 may be an n-type FET and the second FET 1003 may be a p-type FET, or the first FET 1002 may be a p-type FET and the second FET 1003 may be n-type FET). The first and second FETs 1002, 1003 may have the configuration of any of the FETs 100, 200, 300, 400, and 500 depicted in FIGS. 1-5.

Figure 11A:
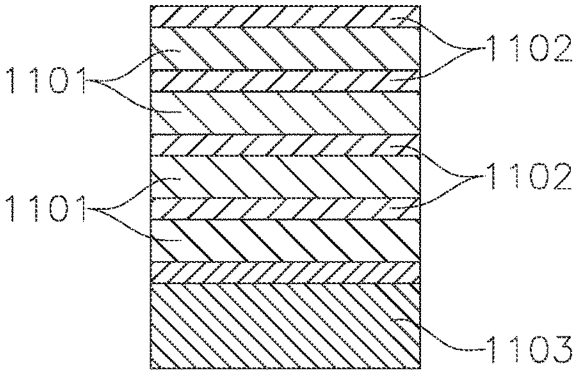
FIGS. 11A-11G depict tasks of a method of manufacturing a FET according to one embodiment of the present disclosure.

FIGS. 11A-11G depict a method of manufacturing a cell 1100 according to one embodiment of the present disclosure. As illustrated in FIG. 11A, the method includes a task of forming or obtaining a stack of alternating sacrificial semiconductor layers 1101 (e.g., Silicon Germanium (SiGe) layers) and semiconductor layers 1102 on a substrate 1103, and a SiGe layer 1117 on the substrate 1103 between the substrate 1103 and the stack of alternating sacrificial semiconductor layers 1101 and the semiconductor layers 1102. In one or more embodiments, the lowermost SiGe layer 1117 has a higher concentration of Germanium (Ge) than the other SiGe layers 1101.

Figure 11B:
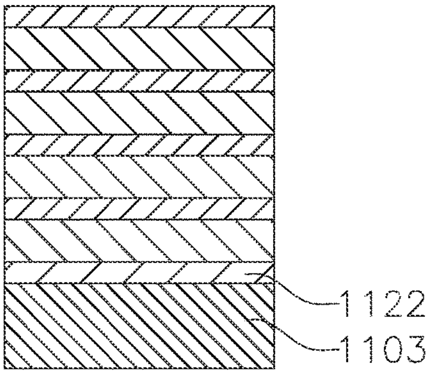

As illustrated in FIG. 11B, the method also includes a task of dielectric isolation utilizing the lowermost sacrificial semiconductor (SiGe) layer 1117.

Figure 11C:
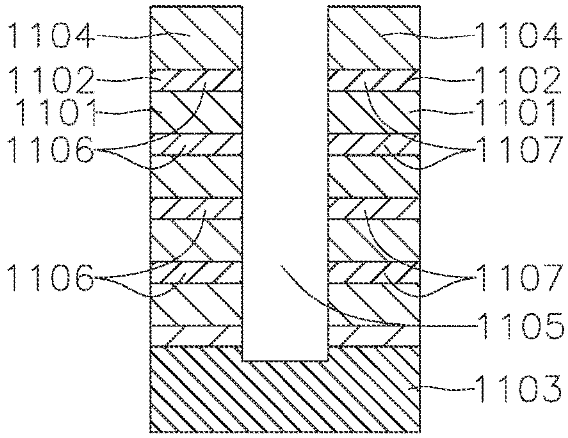

As illustrated in FIG. 11C, the method also includes a task of depositing a hard mask 1104 on an upper surface of the stack of alternating sacrificial semiconductor and semiconductor layers (e.g., depositing a hard mask 1104 on the uppermost semiconductor layer 1102), and a task of etching the stack through the hard mask 1104 to form a first stack of the alternating sacrificial semiconductor and semiconductor layers 1101, 1102, a second stack of the alternating sacrificial semiconductor and semiconductor layers 1101, 1102, and a trench 1105 between (e.g., separating) the first stack from the second stack. In one or more embodiments, the trench 1105 may have a width of approximately 40 nm. The alternating semiconductor layers 1102 in the first stack form a plurality of first prongs 1106 and the alternating layers 1102 in the second stack form a plurality of second prongs 1107. In the illustrated embodiment, the trench 1105 also extends into the substrate 1103.

Figure 11D:
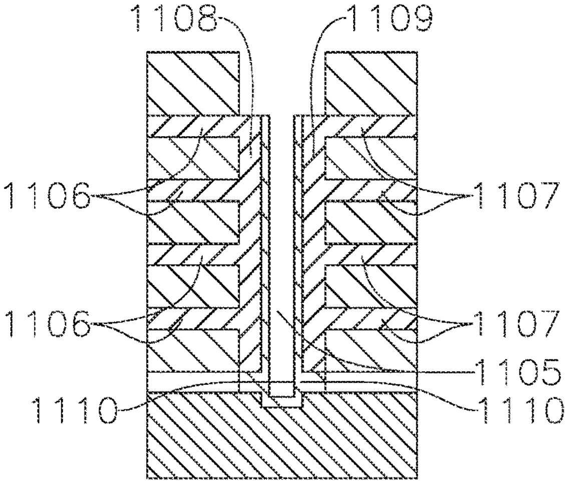

As illustrated in FIG. 11D, the method also includes a task of epitaxially depositing silicon in the trench 1105 to form a first stem 1108 extending along a first sidewall of the trench 1105 in the vertical direction and a second stem 1109 extending along a second sidewall of the trench 1105 in the vertical direction. The first stem 1108 connects the first prongs 1106 together (e.g., the first prongs 1106 are spaced apart from each other along the first stem 1108) and the second stem 1109 connects the second prongs 1107 together (e.g., the second prongs 1107 are spaced apart from each other along the second stem 1109).

As illustrated in FIG. 11D, the method also includes a task of epitaxially depositing silicon germanium (SiGe) on the Si in the trench to form a layer of SiGe 1110 extending in the vertical direction along the first and second stems 1108, 1109. In the illustrated embodiment, the SiGe layer 1110 formed in this task also extends into the portion of the trench 1105 in the substrate 1103 and into the lowermost sacrificial semiconductor (SiGe) layer 1119 such that the SiGe layer 1110 extends underneath the first and second stems 1108, 1109. Following the task of depositing the SiGe layer 1110, a portion of the trench 1105 remains open.

Figure 11E:
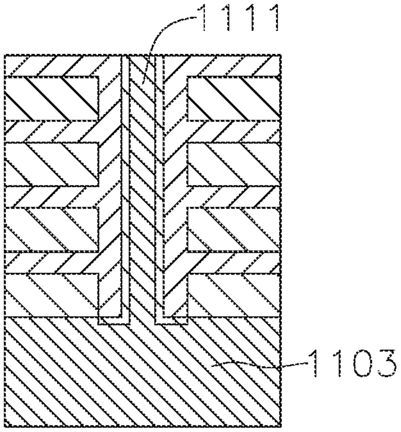

As illustrated in FIG. 11E, the method also includes a task of depositing a dielectric material 1111 in the trench 1105 (e.g., filling the remaining open portion of the trench 1105 with the dielectric material 1111).

Figure 11F:
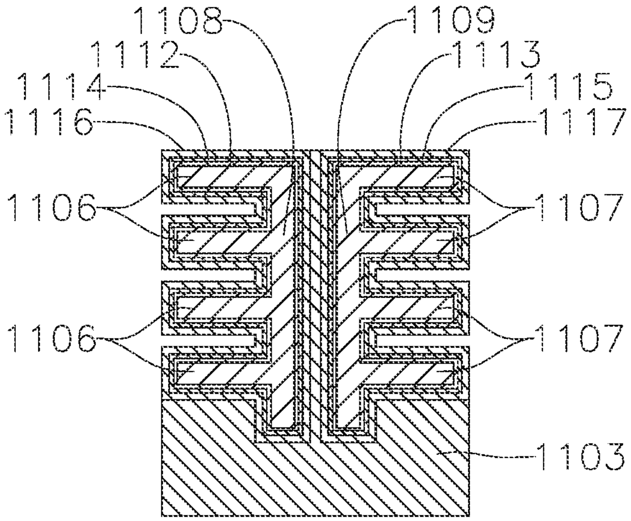

As illustrated in FIG. 11F, the method also includes a task of removing (e.g., wet etching) the SiGe material 1110, depositing a first interfacial layer 1112 around the first prongs 1106 and the first stem 1108 and a second interfacial layer 1113 around the second prongs 1107 and the second stem 1109 after the SiGe material 1110 has been removed, depositing a first high-dielectric-constant (high-k) dielectric layer 1114 on the first interfacial layer 1112 and around the first prongs 1106 and the first stem 1108 and a second high-k dielectric layer 1115 on the second interfacial layer 1113 and around the second prongs 1107 and the second stem 1109, and depositing a first metal layer 1116 on the first high-k dielectric layer 1114 and a second metal layer 1117 on the second high-k dielectric layer 1115.

Figure 11G:
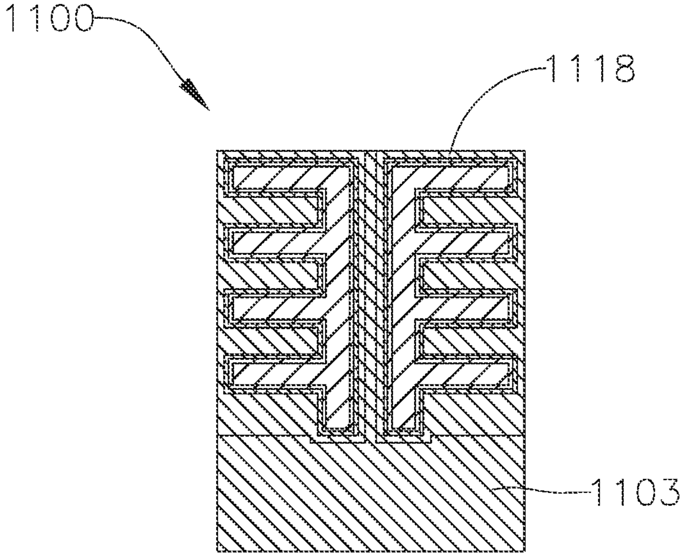

As illustrated in FIG. 11G, the method also includes a task of depositing a metal gate 1118 on the first and second metal layers 1116, 1117 (e.g., performing a gate metal fill) to complete formation of the cell 1100.

Figure 12A:
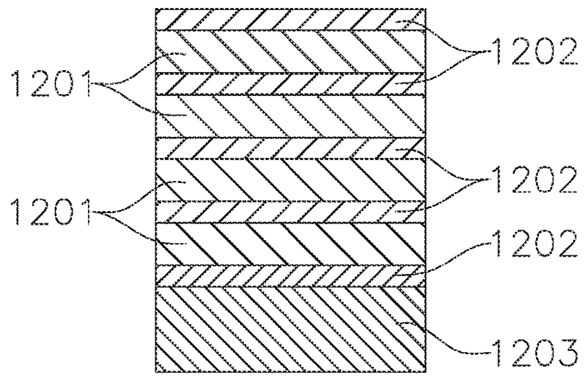
FIGS. 12A-12H depict tasks of a method of manufacturing a FET according to another embodiment of the present disclosure.

FIGS. 12A-12H depict a method of manufacturing a cell 1200 according to another embodiment of the present disclosure. As illustrated in FIG. 12A, the method includes a task of forming or obtaining a stack of alternating sacrificial semiconductor layers 1201 (e.g., Silicon Germanium (SiGe) layers) and semiconductor layers 1202 on a substrate 1203, and a SiGe layer 1222 on the substrate 1203 between the substrate 1203 and the stack of alternating sacrificial semiconductor layers 1201 and the semiconductor layers 1202. In one or more embodiments, the lowermost SiGe layer 1222 has a higher concentration of Germanium (Ge) than the other SiGe layers 1201.

Figure 12B:
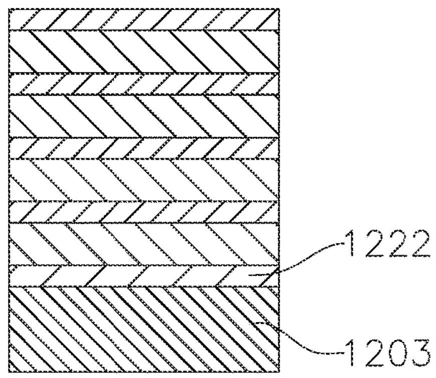

As illustrated in FIG. 12B, the method also includes a task of dielectric isolation utilizing the lowermost sacrificial semiconductor (SiGe) layer 1222.

Figure 12C:
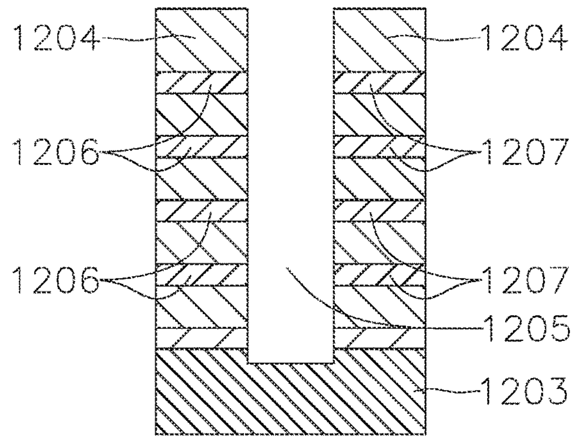

As illustrated in FIG. 12C, the method also includes a task of depositing a hard mask 1204 on an upper surface of the stack of alternating sacrificial semiconductor and semiconductor layers (e.g., depositing a hard mask 1204 on the uppermost semiconductor layer 1202), and a task of etching the stack through the hard mask to form a first stack of the alternating sacrificial semiconductor and semiconductor layers 1201, 1202, a second stack of the alternating sacrificial semiconductor and semiconductor layers 1201, 1202, and a trench 1205 between (e.g., separating) the first stack from the second stack. In one or more embodiments, the trench 1205 may have a width of approximately 40 nm. The alternating semiconductor layers 1202 in the first stack form a plurality of first prongs 1206 and the alternating semiconductor layers 1202 in the second stack form a plurality of second prongs 1207. In the illustrated embodiment, the trench 1205 also extends into the substrate 1203.

Figure 12D:
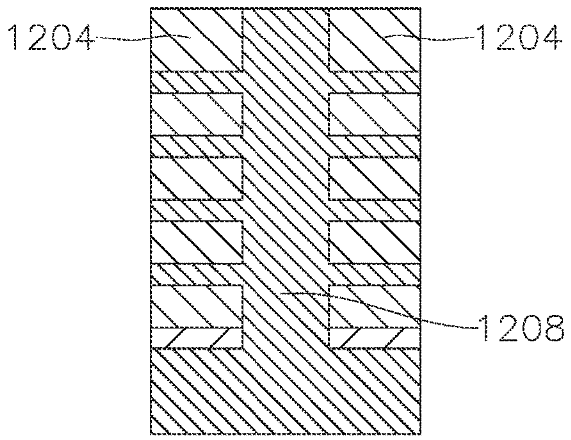

As illustrated in FIG. 12D, the method also includes a task of filling the trench 1205 with silicon 1208 (e.g., epitaxially growing silicon 1208 to fill the trench 1205).

Figure 12E:
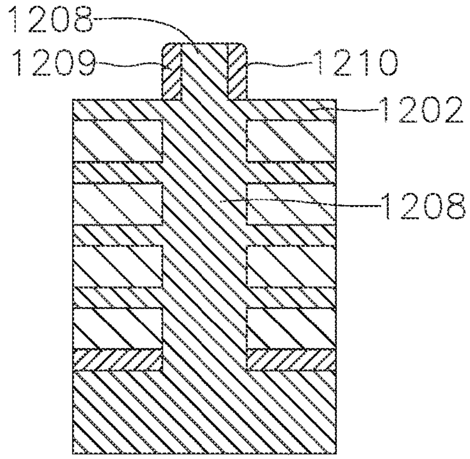

As illustrated in FIG. 12E, the method also includes a task of removing the hard mask 1204, etching a portion of the silicon 1208 extending above the uppermost semiconductor layer 1202 of the stack such that the portion of the silicon 1208 extending above the uppermost semiconductor layer 1202 is narrower than the trench 1205 (e.g., narrower than the portion of the silicon 1208 in the trench 1208), and forming (e.g., depositing) spacers 1209, 1210 on opposite sides of the portion of the silicon 1208 that extends above the uppermost semiconductor layer 1202.

Figure 12F:
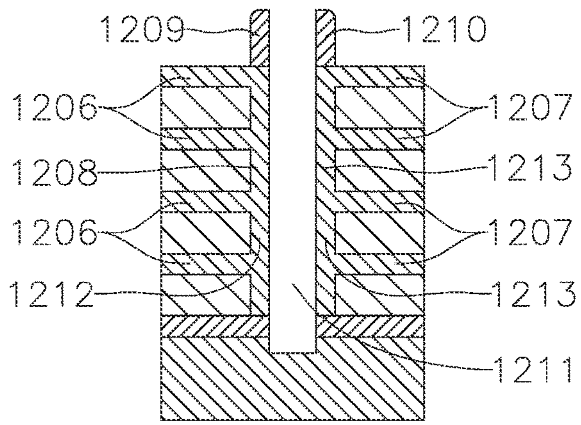

As illustrated in FIG. 12F, the method also includes a task of etching a trench 1211 in the silicon 1208 between the spacers 1209, 1210. Following the task of etching the trench 1211 in the silicon 1208, portions of the silicon 1208 remain along sidewalls of the trench 1211. The portions of the silicon 1208 that remain form a first stem 1212 extending along a first sidewall of the trench 1211 in the vertical direction and a second stem 1213 extending along a second sidewall of the trench 1211 in the vertical direction. The first stem 1212 connects the first prongs 1206 together (e.g., the first prongs 1206 are spaced apart from each other along the first stem 1212) and the second stem 1213 connects the second prongs 1207 together (e.g., the second prongs 1207 are spaced apart from each other along the second stem 1213).

Figure 12G:
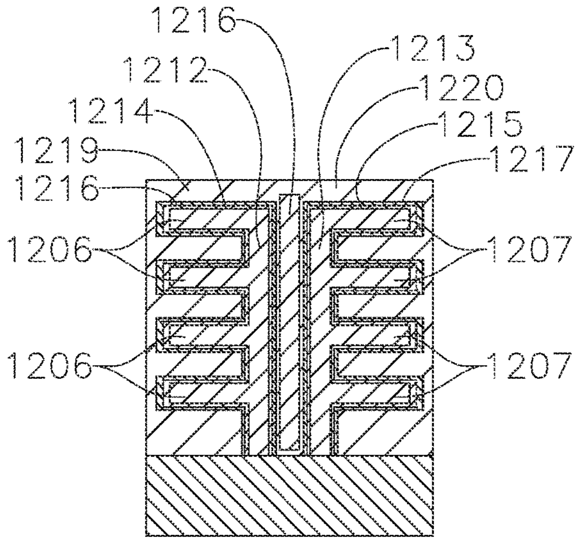

As illustrated in FIG. 12G, the method also includes a task of removing the spacers 1209, 1210, removing (e.g., wet etching) the SiGe material, depositing a first interfacial layer 1214 around the first prongs 1206 and the first stem 1212 and a second interfacial layer 1215 around the second prongs 1207 and the second stem 1213 after the SiGe material has been removed, depositing a first high-k dielectric layer 1216 on the first interfacial layer 1214 and around the first prongs 1206 and the first stem 1212 and a second high-k dielectric layer 1217 on the second interfacial layer 1215 and around the second prongs 1207 and the second stem 1213, depositing a dielectric material in the trench 1211 to form a dielectric wall 1218 separating the first FET from the second FET, and depositing a first metal layer 1219 on the first high-k dielectric layer 1216 and a second metal layer 1220 on the second high-k dielectric layer 1217.

Figure 12H:
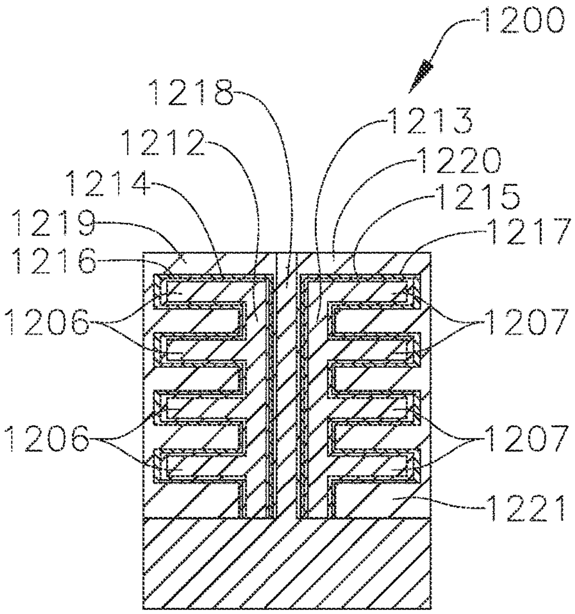

As illustrated in FIG. 12H, the method also includes a task of depositing a metal gate 1221 on the first and second metal layers 1219, 1220 (e.g., performing a gate metal fill) to complete formation of the cell 1200.

While this invention has been described in detail with particular references to embodiments thereof, the embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention.

What is claimed is:

1. A field-effect transistor comprising:
a substrate;
a channel on the substrate, the channel comprising:
a stem comprising silicon extending in a vertical direction from the substrate; and
a plurality of prongs comprising silicon extending in a horizontal direction from the stem and spaced apart from each other along the vertical direction;
an interfacial layer surrounding the stem and the plurality of prongs of the channel;
a dielectric layer on the interfacial layer and surrounding the stem and the plurality of prongs of the channel;
a metal gate on the dielectric layer and surrounding the stem and the plurality of prongs of the channel; and
a dielectric wall on the substrate,
wherein the plurality of prongs extend away from the dielectric wall, and
wherein portions of the interfacial layer, the dielectric layer, and the metal gate are between the dielectric wall and the stem of the channel.

2. The field-effect transistor of claim 1, wherein the stem extends below a lowermost prong of the plurality of prongs.

3. The field-effect transistor of claim 1, wherein the stem is connected to the substrate.

4. A field-effect transistor comprising:
a substrate;
a channel on the substrate, the channel comprising:
a stem comprising silicon extending in a vertical direction from the substrate; and
a plurality of prongs comprising silicon extending in a horizontal direction from the stem and spaced apart from each other along the vertical direction;
an interfacial layer surrounding the stem and the plurality of prongs of the channel;
a dielectric layer on the interfacial layer and surrounding the stem and the plurality of prongs of the channel; and
a metal gate on the dielectric layer and surrounding the stem and the plurality of prongs of the channel,
wherein the stem is separated from the substrate.

5. The field-effect transistor of claim 1, wherein the stem extends above an uppermost prong of the plurality of prongs.

6. The field-effect transistor of claim 1, wherein the stem extends below a lowermost prong of the plurality of prongs and above an uppermost prong of the plurality of prongs.

7. The field-effect transistor of claim 1, wherein the substrate comprises a silicon layer.

8. The field-effect transistor of claim 1, wherein the substrate comprises a dielectric layer.

9. The field-effect transistor of claim 1, wherein the substrate comprises:
a silicon layer; and
a dielectric layer on the silicon layer.

10. The field-effect transistor of claim 1, wherein:
the stem has a width of approximately 4-6 nm and a height of approximately 45-55 nm,
each prong of the plurality of prongs has a width of approximately 10-20 nm and a height of approximately 4-6 nm, and
adjacent prongs of the plurality of prongs are spaced apart in the vertical direction by approximately 10-15 nm.

11. An inverter standard cell comprising:
a first one of the field-effect transistor of claim 1; and
a second one of the field-effect transistors of claim 1.

12. The inverter standard cell of claim 11, wherein the dielectric wall is between the first one of the field-effect transistor and the second one of the field-effect transistor.

13. The inverter standard cell of claim 12, wherein the dielectric wall has a width of approximately 20 nm.

14. The inverter standard cell of claim 12, wherein the first one of the field-effect transistor is one of an NMOS transistor or a PMOS transistor, and wherein the second one of the field-effect transistor is the other of the NMOS transistor or the PMOS transistor.

15. The inverter standard cell of claim 11, wherein the first one of the field-effect transistor and the second one of the field-effect transistor are both NMOS transistors or both PMOS transistors.

16. A method of manufacturing a cell, the method comprising:
forming a stack of alternating sacrificial semiconductor layers and semiconductor layers on a substrate;
forming a hard mask on the stack;
etching the stack through the hard mask to form trench in the stack, the trench dividing the stack into a first stack and a second stack, wherein the semiconductor layers in the first stack comprise a plurality of first prongs and the semiconductor layers in the second stack comprise a plurality of second prongs;
epitaxially depositing silicon in the trench and along inner sidewalls of the first stack and the second stack, wherein the silicon comprises a first stem connected to the plurality of first prongs and a second stem connected to the plurality of second prongs;
epitaxially depositing SiGe in the trench and along the first stem and the second stem;
forming a dielectric wall in the trench;
etching the sacrificial semiconductor layers in each of the first stack and the second stack;
forming a first interfacial layer surrounding the first stem and the plurality of first prongs and a second interfacial layer surrounding the second stem and the plurality of second prongs; and
forming a first metal gate on the first interfacial layer and surrounding the first stem and the plurality of first prongs and a second metal gate on the second interfacial layer and surrounding the second stem and the plurality of second prongs.

17. The method of claim 16, wherein the trench extends into the substrate.

18. A method of manufacturing a cell, the method comprising:
forming a stack of alternating sacrificial semiconductor layers and semiconductor layers on a substrate;
forming a hard mask on the stack;
etching the stack through the hard mask to form trench in the stack, the trench dividing the stack into a first stack and a second stack, wherein the semiconductor layers in the first stack comprise a plurality of first prongs and the semiconductor layers in the second stack comprise a plurality of second prongs;

epitaxially depositing silicon to fill the trench;

forming spacers on opposite sides of the trench;

etching a portion of the silicon in the trench to form a first stem connected to the plurality of first prongs and a second stem connected to the plurality of second prongs;

forming a dielectric wall in the portion of the silicon;

etching the sacrificial semiconductor layers in each of the first stack and the second stack;

forming a first interfacial layer surrounding the first stem and the plurality of first prongs and a second interfacial layer surrounding the second stem and the plurality of second prongs; and forming a first metal gate on the first interfacial layer and surrounding the first stem and the plurality of first prongs and a second metal gate on the second interfacial layer and surrounding the second stem and the plurality of second prongs.

19. The method of claim 18, wherein a portion of the silicon extends above an uppermost semiconductor layer of the plurality of semiconductor layers, and wherein the method further comprises etching the portion of the silicon to be narrower than the trench prior to the forming of the spacers.

20. The method of claim 18, wherein the trench extends into the substrate.

* * * * *